United States Patent [19]
Lefever et al.

[11] Patent Number: 6,111,419
[45] Date of Patent: Aug. 29, 2000

[54] METHOD OF PROCESSING A SUBSTRATE INCLUDING MEASURING FOR PLANARITY AND PROBING THE SUBSTRATE

[75] Inventors: Douglas D. Lefever, Austin; Larry James Bustos, Elgin, both of Tex.

[73] Assignee: Motorola Inc., Schaumburg, Ill.

[21] Appl. No.: 09/080,941

[22] Filed: May 19, 1998

[51] Int. Cl.[7] ................................................. G01R 15/02
[52] U.S. Cl. ............................................ 324/754; 324/758
[58] Field of Search ................................... 324/758, 757, 324/765; 33/533, 545, 158.1, 73.1

[56] References Cited

U.S. PATENT DOCUMENTS

| | | | |
|---|---|---|---|
| 4,751,457 | 6/1988 | Veenendaal | 33/533 |
| 4,820,975 | 4/1989 | Diggle | 324/758 |
| 4,934,064 | 6/1990 | Yamaguchi et al. | 324/758 |
| 4,985,676 | 1/1991 | Karasawa | 324/758 |
| 5,519,944 | 5/1996 | Delastre | 33/533 |
| 5,539,676 | 7/1996 | Yamaguchi | 324/758 |

*Primary Examiner*—Vinh P. Nguyen
*Attorney, Agent, or Firm*—George R. Meyer

[57] ABSTRACT

A substrate (17) is probed after the planarity between a chuck (16) (or the substrate (17)) and a surface of the probing system (20), such as the bottom surface of the interface (28) or test head (22), has been checked. In one method, a measuring tool (30) having a sensor (36) is placed on a chuck (16) of the probing system (20). A distance between a sensor (36) and a surface within the probing system (20) is measured using the sensor (36). The surface is relatively flat. The sensor (36) remains spaced apart from the surface during the measuring. The measuring tool (30) is removed from the chuck (16). The substrate (17) is placed over the chuck (16) after removing the measuring tool (30) and is probed using the probing system (20). Alternatively, more than one sensor (36) can be used. Further, the sensor(s) (66, 76) could be integrated into the chuck (16), interface (28), or test head (22), thereby not requiring a separate measuring tool (30). Additionally, the method can be automated.

19 Claims, 3 Drawing Sheets

METHOD OF PROCESSING A SUBSTRATE INCLUDING MEASURING FOR PLANARITY AND PROBING THE SUBSTRATE

RELATED APPLICATION

This is related to U.S. patent application Nos. 08/662,739 filed Jun. 10, 1996, and 08/844,577 filed Apr. 21, 1997, both of which are assigned to the current assignee hereof.

FIELD OF THE INVENTION

This invention relates in general to methods of probing substrates, and more particularly, to methods of probing substrates after a planarization sequence for a probing system.

BACKGROUND OF THE INVENTION

Probing semiconductor devices in wafer form is becoming more technically challenging as the pad size decreases (smaller pad pitch) and the number of pads on the device increase. FIG. 1 includes an illustration of a prior art probing system 10 that includes a test head 12 and a prober 14. The test head 12 includes contacts along a portion of its bottom surface. The probing system probes a semiconductor device substrate 17 that includes a plurality of die (semiconductor device). The substrate 17 typically is a monocrystalline semiconductor wafer. The prober 14 includes a head plate 142, a load board 144, a pogo stack 146, and a probe card 148 having probe needles 149. The combination of the load board 144, pogo stack 146, and probe card 148 forms the interface 18. One problem with the probing system 10 is aligning the interface 18 to the test head 12. This alignment can be quite problematic and time consuming.

When using the prior art probing system 10, the planarity between the interface 18 and the probe chuck 16 is typically done by replacing the probe card 148 with a fixture typically having several orifices. When adjusting for the planarity between the surface of the probe chuck 16 and the fixture, typically a manual measurement is made (i.e., a micrometer). Based on readings, the interface 18 typically is adjusted using shims. Although this is one method of making sure the probe chuck 16 is planar with the interface 18, manual measurements typically are time consuming, difficult, and require numerous iterations. This planarization sequence requires the test head 12 to be detached from the prober 14 to make the measurements.

Newer systems for probing include a direct docking system as illustrated by the probing system 20 in FIG. 2. The probing system 20 includes a test head 22 and a prober 24. An interface 28 is mounted directly to the test head 22 rather than the prober 24. The interface 28 in this particular prober 20 includes the load board 144, a modified pogo stack 222, and a probe card 148. Because the interface 28, including the probe card 148, is mounted directly to the test head 222, the fixture used for planarization for the probing system 10 in FIG. 1 cannot be used with the probing system 20 in FIG. 2.

As an alternative, optical methods have been used for examining the ends of the probe needles 149. Typically, an optical sensor can be mounted along the side of probe chuck 16 that examines the planarity of the probe needles 149 Adjustments are made using the external mounts 26 in FIG. 2. However, this method also has problems because it assumes that the plane formed by the probing needles 149 and the interface 28 are coplanar, which may not be true. Further, individual probing needles 149 can be distorted to such a degree that planarity cannot be achieved. Therefore, the probing system 20 can still have problematic planarizations.

Regardless of system and method, substrates are virtually never present during a planarization sequence. The likelihood of damage to the substrate is too high.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A substrate is probed after the planarity between a chuck (or the substrate) and surface of the probing system, such as the bottom surface of the interface or test head, has been checked. In one method, a measuring tool having a sensor is placed on a chuck of the probing system. A distance between a sensor and a surface within the probing system is measured using the sensor. The surface is relatively flat; it is not the probe needles. The sensor remains spaced apart from the surface during the measuring. The measuring tool is removed from the chuck. The substrate is placed over the chuck after removing the measuring tool and is probed using the probing system. Alternatively, more than one sensor can be used. Further, the sensor(s) could be integrated into the chuck, interface, or test head, thereby not requiring a separate measuring tool. Additionally, the measuring can be configured so that all of the measuring and adjustments to achieve proper planarity are performed automatically. The present invention is defined by the claims and is better understood after reading the description that follows.

Figure 3:
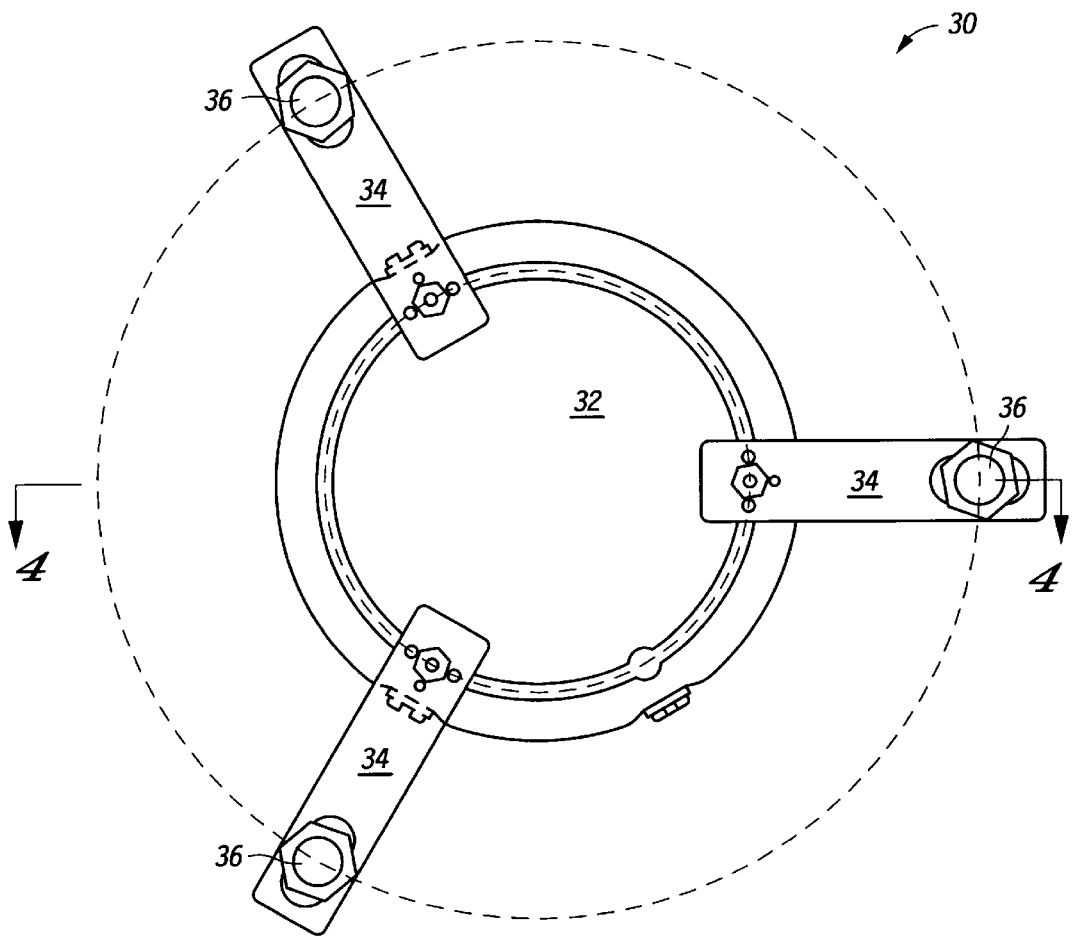
FIGS. 3 and 4 include a top view and a side view, respectively, of a planarity tool used to ensure the planarity between the bottom surface of an interface and the surface of the probe chuck.
Figure 4:
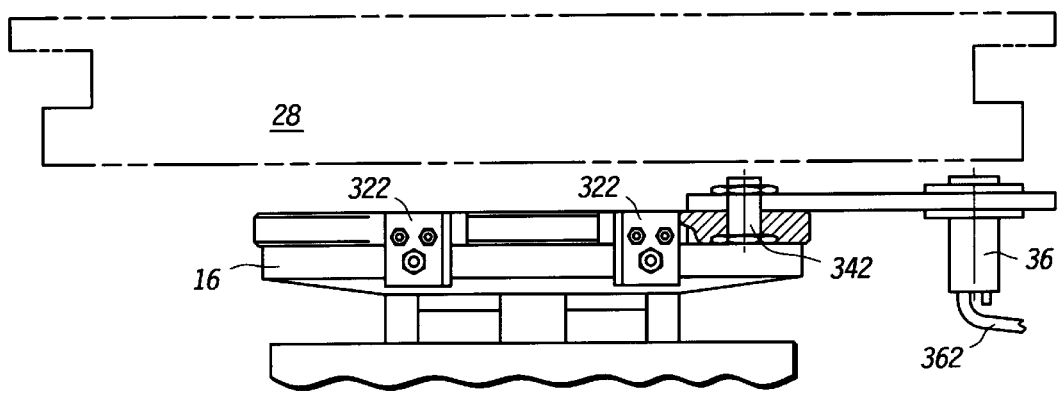

FIGS. 3 and 4 include illustrations of a planarity (measuring) tool 30 used for measuring the planarity between the surface of the probe chuck and the bottom surface of the interface. The planarity tool 30 includes a plate 32, sensor arms 34, and sensors 36. The plate 32 should have good flatness characteristics. The flatness should be less than approximately 5.0 microns per millimeter of length in all directions, and more typically will be less than approximately 2.0 microns per millimeter. Flatness should be kept as low as possible without significantly increasing the cost of the plate 32. Materials selected for the plate should not be susceptible to significant flatness changes. Rigid materials that are easily machined, such as anodized aluminum, are particularly good for the plate 32. Alternative materials, such as plastic, quartz, ceramics, and the like, can be used. However, these alternative materials should not be susceptible to deforming over time or due to heat, humidity or other conditions. The size of the plate 32 varies based on the size of the probe chuck 16. In this particular embodiment, mounting tabs 322 are used to secure the plate 32 to the probe chuck 16 are illustrated in FIG. 4, which includes a partial cross section. Alternatively, the plate 32 can be held onto the probe chuck 16 using vacuum.

Attached to the plate 32 are sensor arms 34 that are held onto the plate 32 by T-bolts 342. In this particular embodiment, three different arms 34 are used. However, a different number of arms 34 could be used, which will be discussed in more detail later. Near the end of each sensor arm 34 is a sensor 36. The sensors 36 can be one of several different types of proximity sensors including inductive, capacitive, infrared, ultraviolet, magnetic, or optical sensors. Optical sensors are sensors that operate in the visible light spectrum and include photodetectors, fiberoptics, and lasers. The actual sensors used can be chosen by one of ordinary skill in the art based on the application and preference of the user. The sensors 36 include sensor wirings 362 as illustrated in FIG. 4 that are connected to an electronic measuring or control system.

Figure 5:
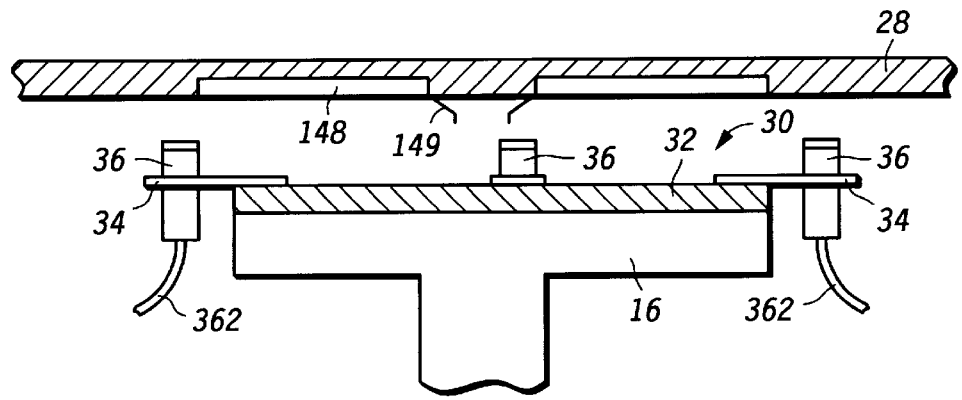
FIG. 5 includes an illustration of a cross-sectional view of the tool of FIGS. 3 and 4 as used in aligning the probe chuck 16 to the interface.

FIG. 5 includes an illustration of the planarity tool 30 when used during the planarization (alignment) process. As illustrated in FIG. 5, the planarity tool 30 has been placed over the probe chuck 16. The sensors 36 are facing the interface 28 of the test head 22 (not identified in FIG. 5), each of which has a relatively flat bottom surface, unlike the probe needles 149. The location of the sensors 36 can vary, but typically lie outside the perimeter of the plate 32. In one particular example, the distance between the center of the plate 32 and a sensor 36 is approximately 140 millimeters. Planarity is achieved when the differential distance, which is maximum distance between one sensor 36 and the surface of the test head 22 or interface 28 minus the minimum distance between a different sensor 36 and that surface, is no more than approximately 25 microns. The distance between the sensors at those two points is called the "displacement distance" in this specification. The planarity ratio is the ratio of the differential distance to the displacement distance. Although this is a specific example, generally, the range can be up to approximately 5.0 microns of differential distance for each millimeter of displacement distance (planarity ratio no greater than approximately 0.005 to 1). More often, the range should be no more than approximately 2.0 microns of differential distance for each millimeter of displacement distance (planarity ratio no greater than approximately 0.002 to 1).

Figure 2:
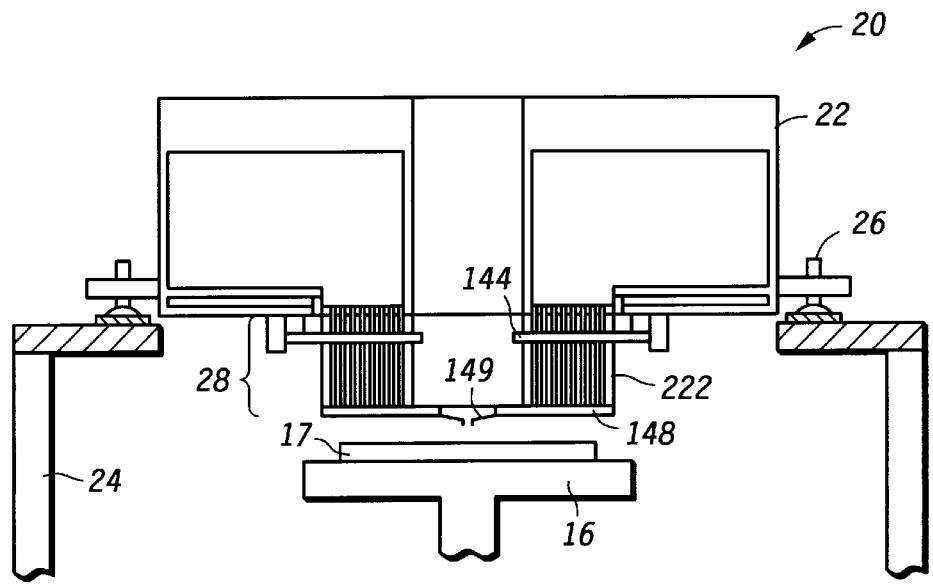

If the planarity is within the specification limits, no adjustments need to be made. However, if outside the specification limits, then the adjustment is made at the external mounts 26 as shown to FIG. 2. The adjustment to the external mounts 26 causes the surfaces of the test head 22 and interface 28 to also be adjusted. This adjustment can be performed by manual manipulation or automatically by use of a stepper motor or the like. Measurements are again taken. The process is repeated until acceptable planarization is achieved. After the planarity has been achieved, the planarity tool 30 is removed and then substrates 17 (not shown in FIG. 5) are probed using the probing system 20.

Figure 6:
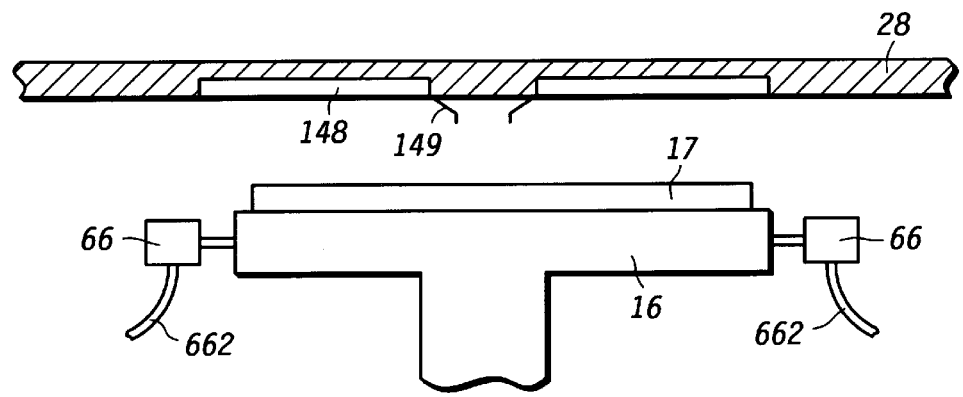
FIG. 6 includes an illustration of a cross-sectional view of the probe system using a modified planarity tool.

FIG. 6 includes an illustration of an alternate embodiment in which sensors 66 are attached to the sides of the chuck 16. Similar to sensors 36, sensors 66 have sensor wirings 662. In this particular embodiment, the planarity is performed while the semiconductor device substrate 17 lies on the probe chuck 16. The planarity measurement can be performed at the beginning of each lot of substrates 17 or at any time throughout the lot.

In other embodiments, different numbers of sensors may be used. Three sensors are typically used as this easily sets the planarity in the x, y, and z axes. As little as one sensor could be used, and in other embodiments, more than three sensors can be used. Returning briefly to FIG. 6, one sensor 66 may be used by scanning the surface of the interface 28 using radiation, such as visible light, infrared, ultraviolet radiation, and the like. After scanning the surface, a determination is made as to the planarity between the chuck 16 and the lower surface of the interface 28. Adjustments would be made accordingly. The scanning can be performed by keeping the chuck stationary and moving the scanner, or by keeping the sensor stationary with respect to the chuck and moving the chuck.

Figure 7:
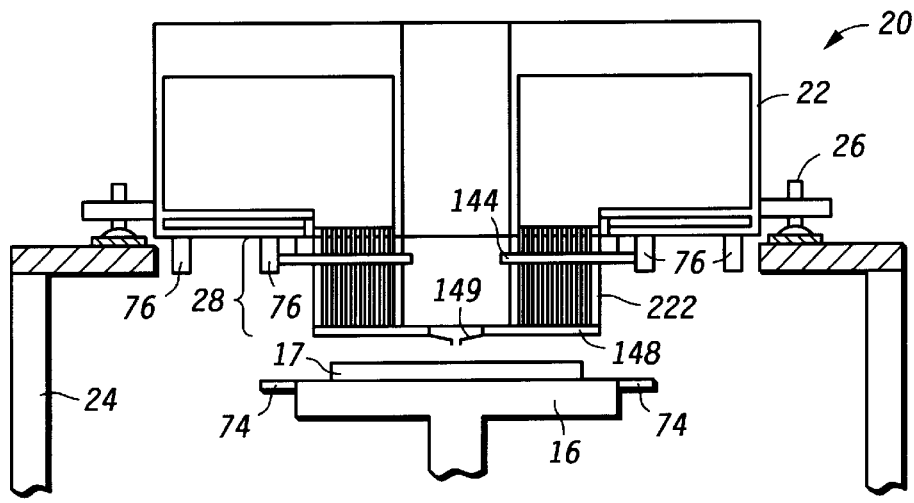
FIG. 7 includes an illustration of a cross-sectional view of a probe system that includes sensors within the test head.

FIG. 7 includes yet another alternative embodiment of the present invention. The sensors 76 can be mounted within the interface 28 or within the test head 22 outside the interface 28. Although FIG. 7 illustrates four sensors 76, the sensors 76 show these two different sensor locations. Typically one set (i.e., within the test head 22) or the other (i.e., within the interface 28) will be used. In the future, probing systems 20 may have interfaces that can be automatically changed. In this particular embodiment, sensors 76 within the interface 28 may help to check planarity anytime the interface 28 is changed.

Similar to sensors 36 and 66, the sensors 76 are used to determine the distance between the interface 28 and any one of the probe chuck 16, the planarity tabs 74, and the substrate 17. The surfaces of the planarity tabs 74 and the probe chuck 16 should lie substantially along the same plane. This measurement can be done with or without the substrate 17 overlying the probe chuck 16. If the planarity measurements are done using the surface of the probe chuck 16, typically the substrate 17 will not be present over the probe chuck 16.

The embodiments previously described have a number of benefits over the prior art. The method using the planarity tool is well adapted for probing systems that use direct docking (interface attached to the test head). This allows the planarity to be measured without using manual methods (i.e., micrometers or the like). Additionally, the sensors are being used to measure planarity of the surfaces of the probe chuck 16 and the interface 28, rather than the probe needles 149. The former planarization method is not susceptible to variations caused by deformed or distorted probe needles.

Still another advantage is that planarization method described can be implemented as an automated process. The wirings 362 or 662 can be coupled to a controller, such as a computer. After measurements have been taken, the computer controls a stepper motor to adjust the external mounts 26.

A further benefit is that the orientation of these sensors can be modified such that the sensors lie at a greater distance from the center of the chuck 16. A more accurate planarization between the probe chuck 16 and the lower surface of the interface 28 can be achieved.

Still another advantage is that the method can be used in conjunction with an automated interface changer. More specifically, interfaces, rather than just probe cards, can be changed between semiconductor device types. Anytime the interface 28 is changed, the planarity should be checked. In this particular embodiment, the sensors 76 would be incorporated and have the electrical connections on the opposite side of the interface 28. The interface 28 would then connect with the test head 22 and readings from the sensors 76 could be transmitted through the test head 22 to a computer or other electronic control system. Adjustments would be made accordingly.

Figure 1:
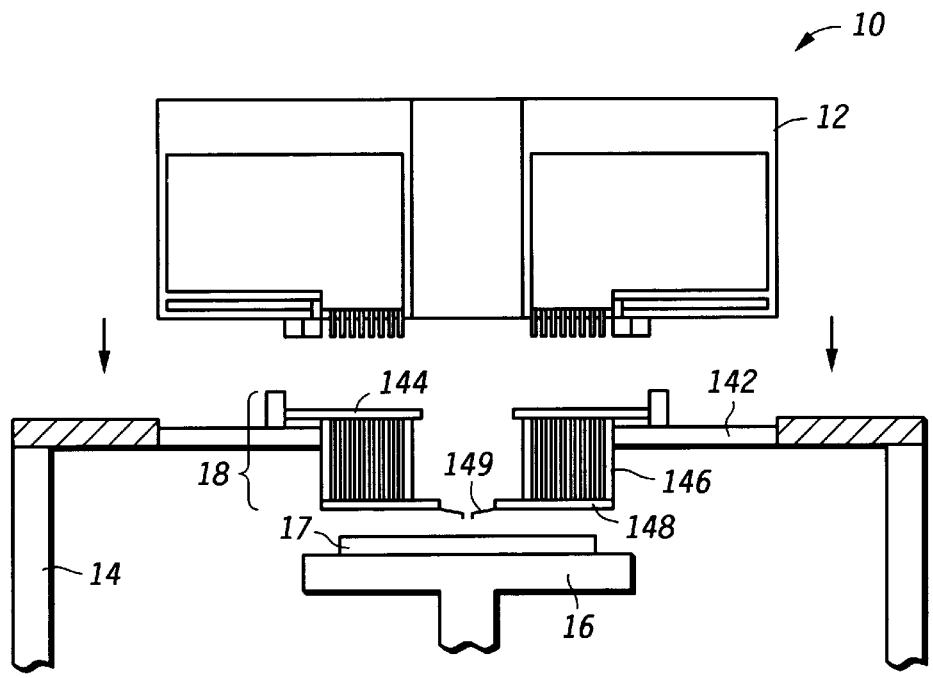
FIGS. 1 and 2 include illustrations of cross-sectional views of prior art probing systems.

Still yet another benefit with the planarity method as previously described is that it can be used in currently existing equipment, including the prior art probe system 10 as illustrated in FIG. 1. The planarity between the bottom of the interface and the prober chuck is measured and after adjustments are made, such as adding shims, the probing system 10 is then locked down and probing can then proceed as normal.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits and other advantages have been described above with regard to specific embodiments. However, the benefits, advantages, and any element(s) that may cause any of the benefits and advantages to occur or become more pronounced are not to be construed as a critical, required, or essential feature or element of any claim.

What is claimed is:

1. A method of processing a substrate comprising: placing a measuring tool comprising:
    first, second, and third sensors on a chuck of a probing system;
    measuring the probing system for planarity, wherein:
        a surface within the probing system is relatively flat;
        the first, second and third sensors remain spaced apart from the surface; and
        measuring the distance comprises measuring the plurality of distances between each sensor and the surface; and
        determining a minimum distance wherein:
            the minimum distance is the distance that is least between the surface and one of the sensors;
        determining a maximum distance wherein:
            the maximum distance is the distance that is greatest between the surface and one of the sensors; and
        determining a planarity ratio, wherein:
            a differential distance is the maximum distance minus the minimum distance;
            a displacement distance is the distance between the two sensors used for the determination of the minimum and maximum distances: and
            the planarity ratio is a ratio of the differential distance to the displacement distance;
    removing the measuring tool from the chuck;
    placing the substrate over the chuck after removing the measuring tool; and
    probing the substrate using the probing system.

2. The method of claim 1, wherein the surface is located on a test head.

3. The method of claim 1, wherein the surface is located on an interface of a test head.

4. The method of claim 1, wherein the substrate includes a semiconductor device substrate having a plurality of die.

5. The method of claim 1, wherein the planarity ratio does not exceed 0.005 to 1.

6. The method of claim 1, wherein:
    the planarity ratio exceeds 0.005 to 1; and
    the method further comprises:
        adjusting the surface;
        measuring the plurality of distances between the first, second, and third sensors and the surface after adjusting the surface;
        determining a minimum distance wherein:
            the minimum distance is the distance that is least between the surface and one of the first, second and third sensors, after adjusting the surface;
        determining a maximum distance wherein:
            the maximum distance is the distance that is greatest between the surface and another one of the first, second and third sensors, after adjusting the surface; and
        determining the planarity ratio after adjusting, wherein the planarity ratio does not exceed 0.005 to 1.

7. A method of processing a substrate comprising:
    providing a probing system including a chuck assembly, wherein the chuck assembly comprises:
        a first, second, and third sensors;
    measuring the probing system for planarity, wherein:
        a surface within the probing system is relatively flat;
        measuring the probing system for planarity includes:
            measuring the distance comprises measuring the plurality of distances between each sensor and the surface; and
            determining a minimum distance wherein:
                the minimum distance is the distance that is least between the surface and one of the sensors;
            determining a maximum distance wherein:
                the maximum distance is the distance that is greatest between the surface and one of the sensors; and
            determining a planarity ratio, wherein:
                a differential distance is the maximum distance minus the minimum distance;
                a displacement distance is the distance between the two sensors used for the determination of the minimum and maximum distances; and
                the planarity ratio is a ratio of the differential distance to the displacement distance;
    placing the substrate over the chuck assembly after measuring; and
    probing the substrate using the probing system.

8. The method of claim 7, wherein measuring comprises scanning the first sensor along the surface.

9. The method of claim 7, wherein the surface is located on an interface of a test head.

10. The method of claim 7, wherein the substrate includes a semiconductor device substrate having a plurality of die.

11. The method of claim 7, wherein measuring, placing, and probing are performed by the probing system.

12. The method of claim 7, wherein the planarity ratio does not exceed 0.005 to 1.

13. The method of claim 7, wherein:
    the planarity ratio exceeds 0.005 to 1; and
    the method further comprises:
        adjusting the surface;
        measuring the plurality of distances between the first, second, and third sensors and the surface, wherein this step is performed after adjusting the surface;
        determining a minimum distance wherein:
            the minimum distance is the distance that is least between the surface and one of the first, second and third sensors, after adjusting the surface;
        determining a maximum distance wherein:
            the maximum distance is the distance that is greatest between the surface and another one of the first, second and third sensors, after adjusting the surface; and
        determining the planarity ratio after adjusting, wherein the planarity ratio does not exceed 0.005 to 1.

14. A method of processing a substrate comprising:

providing a probing system including a test head, an interface and a chuck, wherein at least one of the test head and the interface comprises:
a first, second and third sensors;

measuring the probing system, wherein measuring for planarity the probing system for planarity includes:
measuring the distance comprises measuring a plurality of distances between the first, second, and third sensors and the chuck; and
determining a minimum distance wherein:
the minimum distance is the distance that is least between the surface and one of the sensors;
determining a maximum distance wherein:
the maximum distance is the distance that is greatest between the surface and one of the sensors; and
determining a planarity ratio, wherein:
a differential distance is the maximum distance minus the minimum distance;
a displacement distance is the distance between the two sensors used for the determination of the minimum and maximum distances; and
the planarity ratio is a ratio of the differential distance to the displacement distance;

placing the substrate over the chuck after measuring; and probing the substrate using the probing system.

15. The method of claim 14, wherein measuring comprises scanning the first sensor along the chuck.

16. The method of claim 14, wherein the substrate includes a semiconductor device substrate having a plurality of die.

17. The method of claim 14, wherein measuring, placing, and probing are performed by the probing system.

18. The method of claim 14, wherein the planarity ratio does not exceed 0.005 to 1.

19. The method of claim 14, wherein:

the planarity ratio exceeds 0.005 to 1; and the method further comprises:
adjusting the interface relative to the chuck;
measuring the plurality of distances between the first, second, and third sensors and the chuck, wherein this is performed after adjusting the interface;
determining a minimum distance wherein:
the minimum distance is the distance that is least between the surface and one of the first, second and third sensors, this step is performed adjusting the surface;
determining a maximum distance wherein:
the maximum distance is the distance that is greatest between the surface and another one of the first, second and third sensors, this step is performed after adjusting the surface; and
determining the planarity ratio after adjusting, wherein the planarity ratio does not exceed 0.005 to 1.

* * * * *